US010170186B1

United States Patent
Yau et al.

(10) Patent No.: US 10,170,186 B1
(45) Date of Patent: Jan. 1, 2019

(54) HIGH-DENSITY EEPROM ARRAYS UTILIZING STACKED FIELD EFFECT TRANSISTORS

(71) Applicant: International Business Machines Corporation, Armonk, NY (US)

(72) Inventors: Jeng-Bang Yau, Yorktown Heights, NY (US); Tak Ning, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/702,813

(22) Filed: Sep. 13, 2017

(51) Int. Cl.
| | |
|---|---|
| *G11C 16/04* | (2006.01) |
| *H01L 27/11521* | (2017.01) |
| *H01L 29/788* | (2006.01) |
| *G11C 16/10* | (2006.01) |
| *H01L 27/11551* | (2017.01) |
| *H01L 27/11526* | (2017.01) |

(52) U.S. Cl.
CPC ............ *G11C 16/045* (2013.01); *G11C 16/10* (2013.01); *H01L 27/11521* (2013.01); *H01L 27/11551* (2013.01); *H01L 29/7885* (2013.01); *H01L 27/11526* (2013.01)

(58) Field of Classification Search
CPC ............ G11C 7/1057; G11C 7/12; G11C 7/22
See application file for complete search history.

(56) References Cited

U.S. PATENT DOCUMENTS

| | | | | |
|---|---|---|---|---|
| 4,672,580 A | * | 6/1987 | Yau ........................ | G11C 14/00 257/321 |
| 5,103,275 A | * | 4/1992 | Miura ............... | H01L 27/10817 257/306 |
| 5,306,935 A | | 4/1994 | Esquivel et al. | |
| 5,604,367 A | | 2/1997 | Yang | |
| 5,960,265 A | | 9/1999 | Acovic et al. | |
| 6,094,370 A | * | 7/2000 | Takashima .............. | G11C 11/22 257/E27.104 |
| 6,274,036 B1 | | 8/2001 | Ellis | |
| 6,515,329 B2 | | 2/2003 | Lee et al. | |
| 6,882,010 B2 | | 4/2005 | Bhattacharyya | |
| 6,933,555 B2 | | 8/2005 | Hsieh | |
| 7,700,993 B2 | | 4/2010 | Cai | |

(Continued)

OTHER PUBLICATIONS

List of IBM Patents or Patent Applications Treated as Related. Filed Jun. 28, 2018, 2 pages.

(Continued)

*Primary Examiner* — Tuan T Nguyen
(74) *Attorney, Agent, or Firm* — Michael Purdham

(57) ABSTRACT

Semiconductor device, memory arrays, and methods of writing information to a memory cell include or utilize one or more memory cells. The memory cell(s) include a first transistor located on top of a substrate and connected to a first terminal, a second transistor located on top of the first transistor and connected in parallel to the first transistor and connected to a second terminal, where the first and second transistors share a common floating gate and a common output terminal, and an access transistor connected in series to the common output terminal and a low voltage terminal, the access transistor configured to trigger hot-carrier injection to the common floating gate to change a voltage of the common floating gate.

20 Claims, 7 Drawing Sheets

(56) References Cited

U.S. PATENT DOCUMENTS

| | | | |
|---|---|---|---|
| 8,036,020 B2* | 10/2011 | La Rosa | G11C 7/06 |
| | | | 365/149 |
| 8,198,153 B2 | 6/2012 | Zhu | |
| 8,705,280 B2 | 4/2014 | Cai | |
| 9,634,017 B1 | 4/2017 | Baars et al. | |
| 9,659,655 B1 | 5/2017 | Chan et al. | |
| 9,660,105 B2 | 5/2017 | Divakaruni | |
| 9,755,017 B1 | 9/2017 | Guillorn | |
| 9,780,106 B2 | 10/2017 | Lee | |
| 9,881,926 B1 | 1/2018 | Basker | |
| 2009/0189215 A1 | 7/2009 | Samanta | |
| 2010/0149873 A1 | 6/2010 | Wang | |
| 2011/0193586 A1 | 8/2011 | Kuo | |
| 2012/0175696 A1 | 7/2012 | Franzon | |
| 2017/0278553 A1* | 9/2017 | Kojima | G11C 7/1057 |

OTHER PUBLICATIONS

Reznicek, et al., "Stacked Nanosheet Field Effect Transistor Floating-Gate EEPROM Cell and Array" U.S. Appl. No. 16/020,502, filed Jun. 27, 2018.

IBM et al., "Stacked Dense CMOS RAM Using Silicon on Insulator Technology", An IP.com Prior Art Database Technical Disclosure, IP.com No. IPCOMM000044208D. Original Publication Date: Nov. 1, 1984. IP.com Electronic Publication Date: Feb. 5, 2005. 3 pages.

Unknown, "Advanced Laser Processing enables next generation OLED and LCD Manufacturing", a technology update from Coherent, 2016. 12 pages.

Unknown, "Coherent Applications", Coherent, https://www.coherent.com/applications/index.cfm?fuseaction=Forms.page&PageID=172, last accessed Sep. 8, 2017. 2 pages.

Chan et al., "High-Density EEPROM Arrays Having Parallel-Connected Common-Floating-Gate NFET and PFET as Memory Cell", U.S. Appl. No. 15/437,941, filed Feb. 21, 2017.

Min et al., "A Novel Offset Gated Polysilicon Thin Film Transistor Without an Additional Offset Mask", IEEE Electron Device Letters, vol. 16, No. 5, May 1995. 3 pages.

Pfiester et al., "A Novel PMOS SOI Polysilicon Transistor", IEEE Electron Device Letters, vol. 11, No. 8, Aug. 1990. 3 pages.

List of IBM Patents or Patent Applications Treated as Related, Sep. 12, 2017. 2 pages.

Robertson, "Band offsets of wide-band-gap oxides and implications for future electronic devices", Journal of Vacuum Science & Technology B: Microelectronics and Nanometer Structures. vol. 18. No. 3. May/Jun. 2000. pp. 1785-1791.

Ning, et.al., "Parallel-Connected Merged-Floating-Gate NFET-PFET Eeprom Cell and Array", U.S. Appl. No. 15/798,448, filed Oct. 31, 2017.

* cited by examiner

HIGH-DENSITY EEPROM ARRAYS UTILIZING STACKED FIELD EFFECT TRANSISTORS

BACKGROUND

The present disclosure relates generally to programmable complementary metal oxide semiconductor (CMOS) devices, and more specifically, to programmable CMOS devices comprising an n-type field effect transistor (nFET) and a p-type field effect transistor (pFET) with a commonly connected floating gate for storing electrical charges and methods of operating the same.

Hot carrier injection is a phenomenon in semiconductor devices where a charge carrier (e.g., an electron or a hole) overcomes a potential barrier and, potentially, changes the behavior of a semiconductor device (e.g., a CMOS device). This phenomenon provides one mechanism for the design of an electrically erasable programmable read-only memory (EEPROM), where the behavior of the device is stable over time but can be changed by the application of hot carrier injection.

SUMMARY

Disclosed herein are embodiments of a semiconductor device. The semiconductor device includes a substrate, a first transistor located on top of the substrate and connected to a first terminal, a second transistor located on top of the first transistor and connected in parallel to the first transistor and connected to a second terminal, where the first and second transistors share a common floating gate and a common output terminal, and an access transistor connected in series to the common output terminal and a low voltage terminal, the access transistor configured to trigger hot-carrier injection to the common floating gate to change a voltage of the common floating gate.

Also disclosed herein are embodiments of a memory array. The memory array includes an N by M array of memory cells, wherein N represents the number of rows and M represents the number of columns, located on top of a substrate. Each memory cell of the array includes a first transistor located on top of the substrate and connected to a first terminal and a second transistor located on top of the first transistor and connected in parallel to the first transistor and connected to a second terminal, where the first and second transistors share a common floating gate and a common output terminal. The memory array also includes N access transistors, located on top of the substrate and with one of the N access transistors located in each row of the array, wherein each access transistor is connected in series to a low voltage terminal and the common output terminals of M memory cells in a row, and wherein the access transistors are configured to trigger hot-carrier injection to the common floating gate to change a voltage of the common floating gate.

Also disclosed herein are embodiments of a method of storing information on a memory cell in a memory array formed from an N by M array of memory cells. The method includes connecting a first transistor located on top of a substrate to a first terminal, connecting a second transistor located on top of the first transistor, connected in parallel to the first transistor and connected to a second terminal, where the first and second transistors share a common floating gate and a common output terminal, connecting an access transistor in series to the common output terminal and to a low voltage terminal, and triggering, using the access transistor, hot-carrier injection to the common floating gate to change a voltage of the common floating gate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
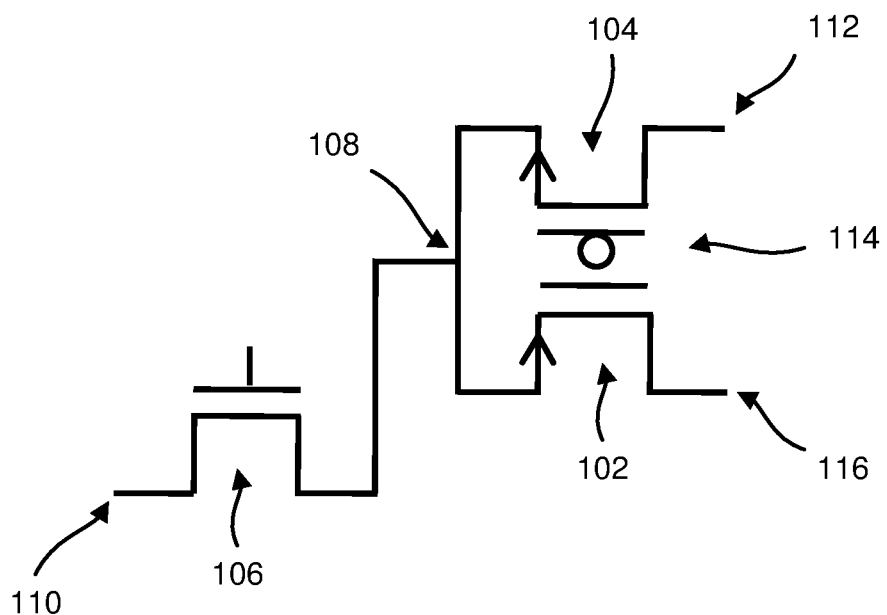
FIG. 1 depicts a circuit schematic for a single electrically erasable programmable read-only memory (EEPROM) cell and an access transistor, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate generally to the field of programmable complementary metal oxide semiconductor (CMOS) devices, and more specifically, to programmable CMOS devices comprising an n-type field effect transistor (nFET) and a p-type field effect transistor (pFET) with a commonly connected floating gate for storing electrical charges and methods of operating the same. While the present disclosure is not necessarily limited to such applications, various aspects of the disclosure can be appreciated through a discussion of various examples using this context.

Existing designs for CMOS EEPROM devices suffer from inefficiencies in the application of hot hole injection. In particular, the use of silicon dioxide as a gate dielectric in CMOS devices results in a high energy barrier for the injection of hot holes (e.g., about 5 eV), such that the possible designs for CMOS EEPROM designs are limited.

Embodiments of the present disclosure implement common floating gate complementary metal oxide semiconductor (CMOS) electrically erasable programmable read-only memory (EEPROM) devices using gate dielectric materials that reduce the energy barrier for hot hole injection in an n-type field effect transistor (nFET) and the energy barrier for hot electron injection in a p-type field effect transistor (pFET). By lowering the energy barrier for hot hole injection in the nFET, some present embodiments make it possible to have the efficiency of hot hole injection in the nFET to be comparable to the efficiency of hot electron injection in the pFET. In one specific set of embodiments, a pair of field effect transistors (FETs), one nFET and one pFET are arranged in a stacked formation wherein the pFET is located on top of the nFET. Such EEPROMs can be formed in an array to create addressable memory. The pair of FETs are arranged electrically in parallel with a common floating gate. By arranging the FETs such that they are stacked, more such EEPROM cells may be placed in the same area than conventional designs. This can result in a higher density of EEPROM cells on a chip, such that larger amounts of memory can be located on a chip and/or smaller chips can be used. In the embodiments disclosed herein, one access transistor is present in each row of an EEPROM array, which can result in a higher density of EEPROM cells on a chip than designs utilizing an access transistor per cell, such that larger amounts of memory can be located on a chip and/or smaller chips can be used.

The aforementioned improvements and/or advantages of efficiency of hot hole injection, efficiency of hot electron injection, and space savings are example improvements and/or advantages. These improvements and/or advantages are a non-exhaustive list of example advantages. Embodiments of the present disclosure exist which can contain none, some, or all of the aforementioned advantages and/or improvements.

In one or more embodiments, a semiconductor structure is provided. The semiconductor structure includes a first transistor connected to a first terminal, a second transistor connected in parallel to the first transistor and a second terminal, where the first and second transistors share a common floating gate and a common node, and an access transistor connected in series to the common node and a low voltage terminal, the access transistor configured to trigger hot-carrier injection to the common floating gate to change a voltage of the common floating gate.

In one or more embodiments, a stacked and electrically parallel-connected nFET and pFET with a common floating gate as a memory cell is provided that is capable of high efficiency programming/erasure utilizing avalanche hot-electron and hot-hole injections in the pFET and the nFET, respectively, and high-density memory arrays consisting of such memory cell are also provided.

In one or more embodiments, parallel connection of the nFET and pFET enables symmetric operation of the nFET and pFET. One source/drain region of the pFET is connected to a pFET terminal and one source/drain region of the nFET is connected to an nFET terminal. The other source/drain region of the pFET and the other source/drain region of the nFET are connected together at a common node. An access transistor is connected in series to the common node and a low voltage terminal, which can be at ground. When the access transistor is turned on, the common node is pulled down to the low voltage, and a voltage applied to the pFET terminal induces hot-electron injection in the pFET while a voltage applied to the nFET terminal induces hot-hole injection in the nFET. In one or more embodiments, an electrically parallel-connected nFET/pFET EEPROM device is provided with common floating-gate having efficient avalanche hot-electron injection in a pFET and efficient avalanche hot-hole injection in an nFET.

In one or more embodiments, hot-carrier injection efficiency can be improved significantly by reducing the energy barrier for injection. Efficient avalanche hot-electron injection in a pFET is achieved by using silicon nitride ($Si_3N_4$), yttrium oxide ($Y_2O_3$), zirconium oxide ($ZrO_2$), or hafnium oxide ($HfO_2$) for a gate dielectric. These gate dielectric materials all have dielectric constant larger than silicon dioxide ($SiO_2$) and are usually referred to as high-k gate dielectrics. Efficient avalanche hot-hole injection in an nFET is achieved by using silicon nitride ($Si_3N_4$), yttrium oxide ($Y_2O_3$), zirconium oxide ($ZrO_2$), or hafnium oxide ($HfO_2$) for a gate dielectric. The common-floating-gate parallel-nFET-pFET EEPROM device can be built on bulk Si, SOI, and/or using thin films of silicon on insulator. There can also be a thin interfacial SiO2 layer between device body (silicon) and high-k dielectric. The interfacial SiO2 should be sufficiently thin, e.g. less than 1 nm, to allow efficient tunneling of hot carriers through it.

In one or more embodiments, a memory array is provided. The memory array includes an x by y array of memory cells, each memory cell comprising a first transistor connected to a first terminal, a second transistor connected in parallel to the first transistor and a second terminal, where the first and second transistors share a common floating gate and a common node, wherein an access transistor is connected in series to a low voltage terminal and the common node of y memory cells in a row, the access transistor configured to trigger hot carrier injection to the common floating gate to change a voltage of the common floating gate.

In one or more embodiments, a method for storing information on a memory cell in a memory array formed from an x by y array of memory cells is provided. The method includes connecting a first transistor to a first terminal, connecting a second transistor in parallel to the first transistor and a second terminal, where the first and second transistors share a common floating gate and a common output node, and connecting an access transistor in series to the common node and a low voltage terminal, the access transistor configured to trigger hot-carrier injection to the common floating gate to change a voltage of the common floating gate.

In one or more embodiments, EEPROM cells and memory arrays are provided employing common-floating-gate parallel-nFET-pFET devices having efficient avalanche hot-electron injection in a pFET and efficient avalanche hot-hole injection in an nFET, with one access transistor per wordline. The array can be built on bulk Si, SOI, and/or thin films of polycrystalline Si on insulator. The CMOS peripheral circuits can be built on bulk and/or SOI silicon, independent of the array.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device located at the end of the channel, in which majority carriers are flowing into the channel.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It is to be understood that aspects of the present disclosure will be described in terms of a given illustrative architecture; however, other architectures, structures, substrate materials and process features and steps/blocks may be varied within the scope of aspects of the present disclosure. It should be noted that certain features cannot be shown in all figures for the sake of clarity. This is not intended to be interpreted as a limitation of any particular embodiment, or illustration, or scope of the claims.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements may be included in the compound and still function in accordance with the present principles. The compounds with additional elements will be referred to herein as alloys.

Referring now to FIG. 1, a circuit schematic is shown for a single electrically erasable programmable read-only memory (EEPROM) cell 100 and an access transistor 106. The EEPROM cell 100 is formed from a first transistor 102 and a second transistor 104 with a shared gate terminal 114. The transistors 102 and 104 are arranged in parallel with a source/drain region of the first transistor 102 and a source/drain region of the second transistor 104 connected together at a common node 108. The other source/drain region of the first transistor 102 is connected to a voltage terminal 116, and the other source/drain region of the second transistor 104 is connected to a voltage terminal 112. An access transistor 106 is connected to a low voltage terminal 110 and the common node 108 in series. When the access transistor is turned on, the common node 108 is pulled down to approximately the same voltage as the low voltage terminal 110.

In one example embodiment, the low voltage terminal 110 is at ground. In some embodiments, the first transistor 102 is an n-type field effect transistor (nFET) and the second transistor 104 is a p-type field effect transistor (pFET). In one embodiment, the access transistor 106 can be an nFET, though it should be understood that the particular configuration of the access transistor 106 can be adapted by those having ordinary skill in the art to the particular application. The first and second transistors 102 and 104 have a common output terminal 108.

The access transistor 106 controls writing to and reading from the EEPROM cell 100. The state of the device is held by the state of the common floating gate 114. When the access transistor 106 is turned on, it pulls the common terminal 108 to approximately the same voltage as the low voltage terminal 110. When the common terminal 108 is pulled down to the same voltage as the low voltage terminal 110, hot carrier injection to the gate can occur in the first transistor 102 if a sufficiently high voltage is applied to terminal 116, and hot carrier injection to the gate can occur in the second transistor 104 if a sufficiently high voltage is applied to terminal 112. These charges due to hot carrier injection will remain on the floating gates until neutralized by charges of the opposite polarity (e.g., negatively charged electrons will remain until they meet positively charged holes and holes will remain until they meet electrons). Operations of reading from and writing to an EEPROM cell, such as EEPROM cell 100, are discussed in further detail below in regard to methods 400, 500, and 600 of FIGS. 4-6, respectively.

In a CMOS device, electrons are free to move about in the semiconductor conduction band and holes are free to move about in the semiconductor valence band. The conduction band of the gate dielectric is at a higher electron energy level than the semiconductor conduction band. This energy difference represents a barrier energy for an electron getting from the semiconductor into the gate dielectric. For an electron to jump from the semiconductor into the gate dielectric, it has to acquire a kinetic energy equal to or greater than this barrier energy.

An electron having a kinetic energy larger than its thermal energy, which is determined by the semiconductor temperature, is referred to as a "hot" electron. Similarly, the valence band of the gate dielectric is at a higher hole energy level than the semiconductor valence band. This energy difference represents a barrier energy for a hole getting from the semiconductor into the gate dielectric. For a hole to jump from the semiconductor into the gate dielectric, it typically acquires a kinetic energy equal to or greater than this hole barrier energy. A hole having a kinetic energy larger than its thermal energy is referred to as a "hot" hole.

For an FET that uses silicon dioxide for a gate dielectric layer, hot electrons typically need a kinetic energy of about 3.1 eV, which is an energy barrier for electrons to be injected efficiently from the FET semiconductor into the FET gate dielectric. Hot electrons having smaller kinetic energy of, e.g., about 2.8 eV, may still be injected from the FET semiconductor into the FET gate dielectric by a tunneling process which is very inefficient. For a hot hole in such an FET, a higher kinetic energy of about 4.8 eV, which is the energy barrier for holes, is needed for it to be injected efficiently from the FET semiconductor into the FET gate dielectric. Hot holes having smaller kinetic energy of, e.g., about 3.1 eV, can only tunnel from the FET semiconductor into the FET gate dielectric, but at a negligibly slow rate.

The charge on the shared floating gate 114 determines which of the two transistors is active. The accumulated charges on the shared floating gate 114 will determine the voltage on the gate of the devices relative to their source terminals and will turn those devices off or on, such that appreciable current will flow between terminal 116 and the common terminal 108 or between terminal 112 and common terminal 108 when the access transistor 106 is activated.

Figure 2A:
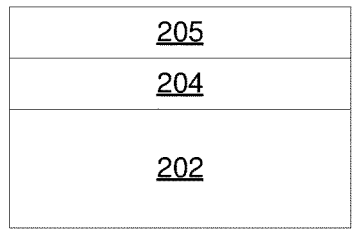
FIGS. 2A-2K depict the formation of and resultant EEPROM cell wherein the pFET is stacked upon the nFET, in accordance with some embodiments of the present disclosure.
Figure 2B:
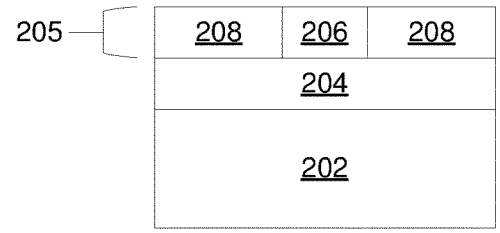
Figure 2C:
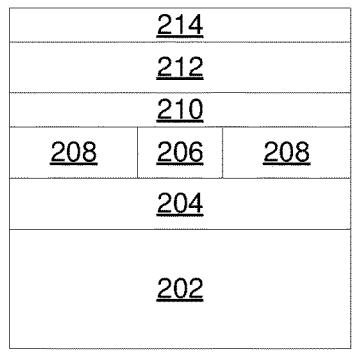
Figure 2D:
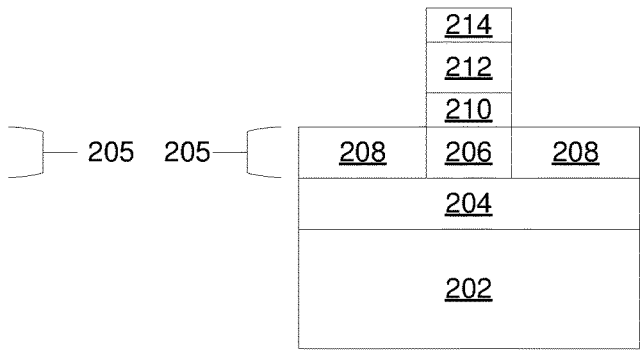
Figure 2E:
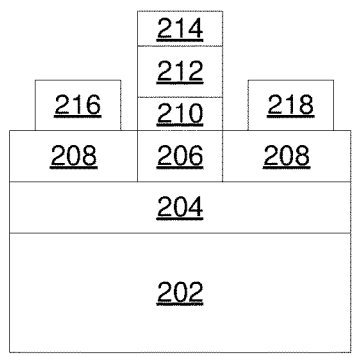
Figure 2F:
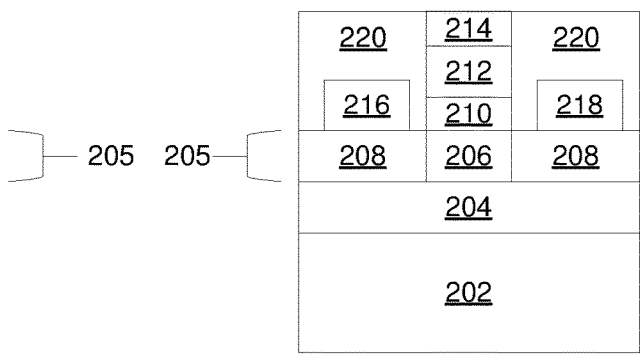
Figure 2G:
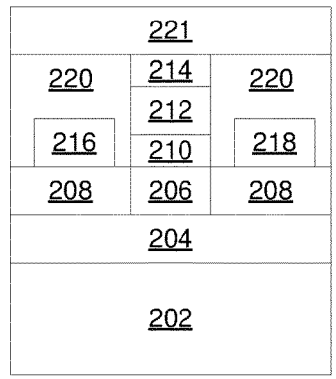
Figure 2H:
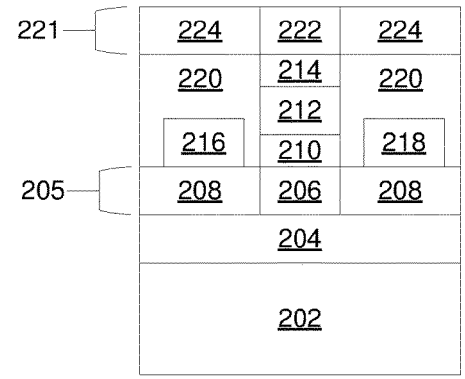
Figure 2I:
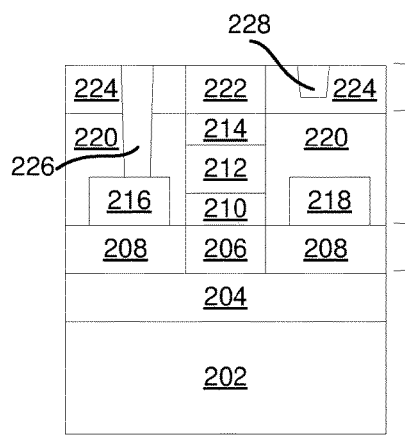
Figure 2J:
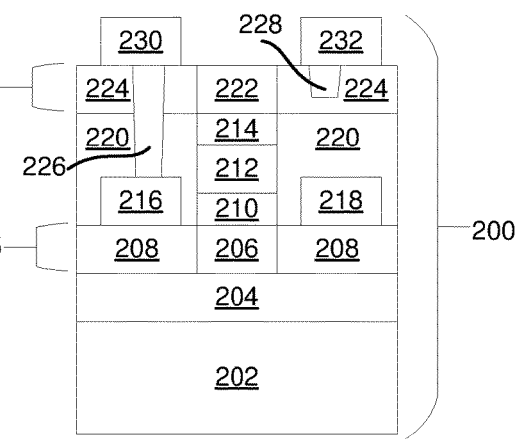
Figure 2K:
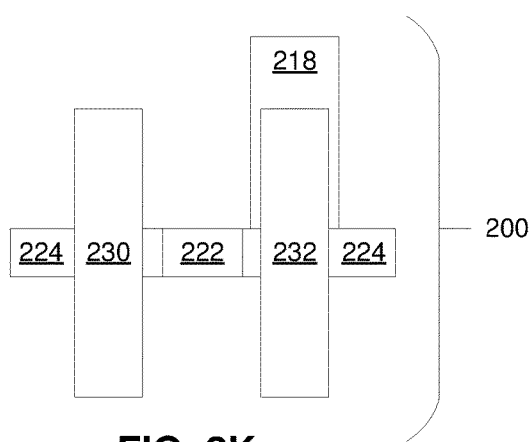

Referring now to FIGS. 2A-2K, illustrated are diagrams showing the formation of and resultant EEPROM cell 200 wherein the pFET is stacked upon the nFET. In some embodiments, EEPROM cell 200 is consistent with FIG. 1's EEPROM cell 100. FIGS. 2A-2J illustrate side views of the formation of and resultant EEPROM cell 200 and FIG. 2K shows a top view of the resultant EEPROM cell 200. Beginning with FIG. 2A, shown is a silicon on insulator (SOI) substrate, comprising a silicon substrate 202, an insulator layer 204, and a silicon layer 205. The insulator layer 204 can be a buried oxide (BOX) layer in some embodiments. The choice of materials for the insulator layer 204 can vary in embodiments, including for example, silicon dioxide or sapphire. In some embodiments, instead of a SOI substrate, the EEPROM cell 200 can be built using bulk silicon and/or using thin films of silicon on insulator. Due to the floating body effect, avalanche hot-carrier injection is more efficient when using a SOI substrate as shown or using thin-film polycrystalline silicon on insulator than bulk silicon. In some embodiments, layer 205 can be a silicon-containing semiconductor material such as, e.g., silicon, silicon germanium, silicon germanium carbide, silicon carbide, polysilicon, epitaxial silicon, amorphous silicon, and multilayers thereof. Although silicon is the predominately used semiconductor material in wafer fabrication, alternative semiconductor materials can be employed instead, such as, but not limited to, germanium, gallium arsenide, gallium nitride, cadmium telluride, and zinc selenide.

FIG. 2B shows the SOI substrate from FIG. 2A where the silicon layer 205 has been doped to form p-doped region 206 and n-doped regions 208. In some embodiments, silicon layer 205 from FIG. 2A can begin as either p-doped or n-doped and the opposite region(s) (206 or 208) can be formed using photolithography and ion implantation. In some embodiments, silicon layer 205 from FIG. 2A can be sequentially transformed using photolithography and ion implantation into p-doped region 206 and n-doped regions 208. Formation of either p-doped region 206 or n-doped regions 208 can occur first, followed by formation of the other region(s). Ion implantation for p-doped region 206 can be performed by implantation of an appropriate p-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium, and/or indium. Ion implantation for n-doped regions 208 can be performed by implantation of an appropriate n-type dopant. As used herein, "n-type" refers to the addition of impurities that contributes free electrons to an intrinsic semiconductor. In a silicon-containing substrate, examples of n-type dopants, i.e., impurities, include but are not limited: phosphorus, arsenic, antimony, and/or bismuth.

FIG. 2C shows the product from FIG. 2B with three additional layers of material, which may be deposited onto the silicon layer 205, which includes p-doped region 206 and n-doped regions 208. First is nFET gate dielectric 210, which will serve as the gate dielectric for the nFET of the EEPROM cell 200. The gate dielectric 210 affects the properties of the device, in particular with respect to hot carrier injection. Efficient hot hole injection can be achieved in nFETs using gate dielectrics such as, e.g., silicon nitride ($Si_3N_4$), yttrium oxide ($Y_2O_3$), zirconium oxide ($ZrO_2$), or hafnium oxide ($HfO_2$). The second additional layer is a layer of polycrystalline-silicon (alternatively referred to as poly-silicon or poly-Si), which will serve as the common floating gate 212 for the nFET and the pFET of the EEPROM cell 200. The third additional layer is pFET gate dielectric 214, which will serve as the gate dielectric for the pFET of the EEPROM cell 200. The gate dielectric 214 affects the properties of the device, in particular with respect to hot carrier injection. Efficient hot electron injection can be achieved in pFETs using gate dielectrics such as, e.g., silicon nitride ($Si_3N_4$), yttrium oxide ($Y_2O_3$), zirconium oxide ($ZrO_2$), or hafnium oxide ($HfO_2$). These materials are referred to herein as low injection-barrier materials. Each of these materials provide energy barriers significantly lower than that imposed by silicon dioxide.

The use of low injection-barrier materials for the gate dielectric of nFET and pFET makes it possible to implement the EEPROM cell 200 as described. This structure allows efficient injection (e.g., fast injection at low voltage) of hot holes in the nFET into the common gate, thus turning on the nFET, and efficient injection of hot electrons in the pFET into the common gate, thus turning off the nFET. The detailed operation of the EEPROM cell 200, including writing, erasing, and reading is described in greater detail below.

Referring now to FIG. 2D, shown is the partially formed EEPROM cell from FIG. 2C where the gate dielectric layers 210 and 214, and the common floating gate 212 have been patterned via photolithography and etching. Through this process, layers 210, 212, and 214 have been removed from above n-doped regions 208. This etching can be performed using various processes, including, but not limited to, reactive-ion etching (RIE), to remove the material above n-doped regions 208. At this stage, formation of the nFET, which includes p-doped region 206 and n-doped regions 208, nFET gate dielectric 210, and common floating gate 212, is complete.

Referring now to FIG. 2E, shown is the partially formed EEPROM cell from FIG. 2D with metal contacts 216 and 218 deposited onto the surfaces of n-doped regions 208. This may occur using photolithography and metal deposition using any suitable metal for contacting with a semiconductor including, e.g., tungsten or copper.

Referring now to FIG. 2F, shown is the partially formed EEPROM cell from FIG. 2D with a dielectric layer 220 covering the metal contacts 216 and 218 and the previously exposed surfaces of n-doped regions 208. This dielectric material can be any suitable dielectric, including for example silicon dioxide. In some embodiments, this dielectric material may be deposited over the entire surface, including over pFET gate dielectric 214, followed by removal of excess material by planarization to expose pFET gate dielectric 214.

Referring now to FIG. 2G, shown is the partially formed EEPROM cell from FIG. 2F with a thin-film layer 221 of polycrystalline silicon on top of dielectric layer 220. Thin-film layer 221 of polycrystalline silicon can be formed, for example, via excimer laser crystallization. This process can include deposition of amorphous silicon using various techniques, followed by scanning a laser beam across the substrate to crystalize the amorphous silicon to form thin-film layer 221 of polycrystalline silicon.

Referring now to FIG. 2H, shown is the partially formed EEPROM cell from FIG. 2G where the thin-film layer 221 of polycrystalline silicon has been doped to form p-doped regions 224 and n-doped region 222. The doping of thin-film layer 221 of polycrystalline silicon can occur much the same as discussed above regarding FIG. 2B and silicon layer 205. At this stage, formation of the pFET, which includes p-doped regions 224 and n-doped region 222, pFET gate dielectric 214, and common floating gate 212, is complete.

Referring now to FIG. 2I, shown is the partially formed EEPROM cell from FIG. 2H where contact via holes 226 and 228 have been created and filled with metal. This process can start with defining the via holes by photolithography and etching, which can be by either wet or dry etching. Following formation of the via holes, the via holes can be filled with metal through a deposition process, followed by planarization to remove any excess metal. The metal chosen to fill the vias can be of any suitable composition including, e.g., tungsten or copper.

Referring now to FIG. 2J, shown is a side view of the completed EEPROM cell 200. FIG. 2J can be reached from partially formed EEPROM cell from FIG. 2I once metal contacts 230 and 232 have been deposited on top of the filled contact via holes 226 and 228. This may occur using photolithography and metal deposition using any suitable metal for contacting with a semiconductor including, e.g., tungsten or copper. The metal contacts 216 and 230, which are connected by metal-filled contact via hole 226, can connect to and form a wordline (such as wordlines WL0, WL1, and WL2 of FIG. 3 described below). The metal contacts 218 and 232 may connect to and form a pair of separate bitlines (such as bitlines B0R and B0L, B1R and B1L, or B2R and B2L of FIG. 3 described below). Collectively, these metal contacts can allow for application of one or more voltages to the connected portions of EEPROM cell 200 and enable operation of EEPROM cell 200 in accordance with methods 400, 500, and 600 (discussed below with regard to FIGS. 4, 5, and 6, respectively). While EEPROM cell 200 is shown with the nFET located below the pFET, alternative designs with the pFET located below the nFET are contemplated by this disclosure and may be created using the teachings disclosed herein.

Referring now to FIG. 2K, shown is a top view of the completed EEPROM cell 200. From the top, portions of p-doped regions 224 and n-doped region 222 are visible, as are metal contacts 230 and 232. As illustrated in FIG. 2K, metal contacts 230 and 232 extend beyond the surface of the EEPROM cell 200 to form a wordline and a bitline respectively. Additionally shown is metal contact 218, which is below metal contact 232. While metal contact 218 is shown to be wider and longer than metal contact 232, these contacts can be of the same or different dimensions and the illustration serves to show the depth, not necessarily the size, of metal contact 218. As illustrated in FIG. 2K, metal contact 218 extends beyond the edge of the EEPROM cell 200 to form a bitline.

Figure 3:
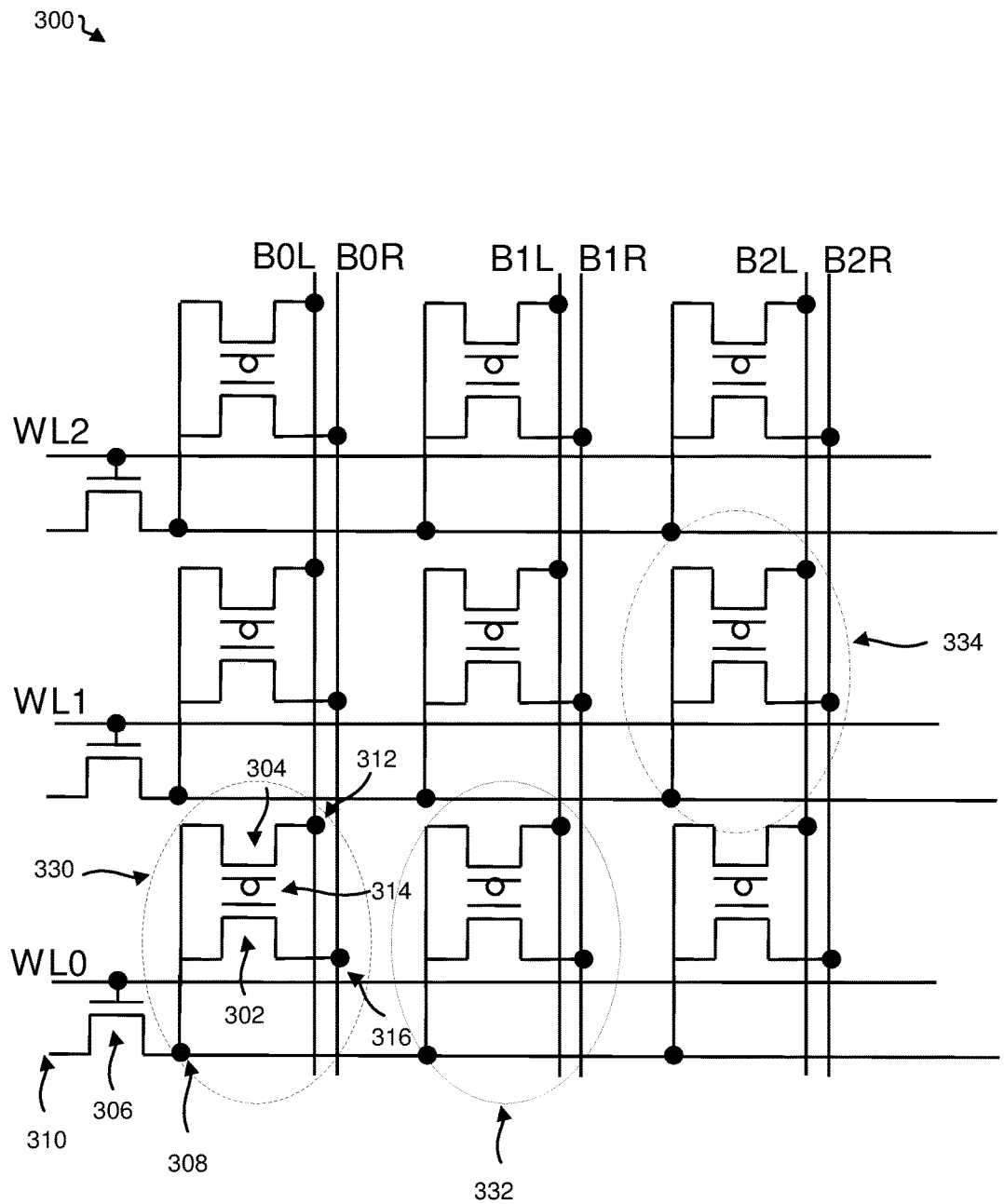
FIG. 3 depicts a circuit schematic of an array of EEPROM cells, in accordance with some embodiments of the present disclosure.

Referring now to FIG. 3, depicted is a circuit schematic of an array 300 of EEPROM cells, including cells 330, 332, and 334 (which in some embodiments can each be consistent with EEPROM cell 100 of FIG. 1 and/or EEPROM cell 200 of FIG. 2). One such EEPROM cell 330 is shown within the dashed ellipse. This array 300 has a 3×3 grid of EEPROM cells, which consists of three rows and three columns. In other embodiments, the array of EEPROM cells may have different numbers of rows, different numbers of columns, or both. Such an array may be described as an x by y array with x rows and y columns. The bottom row of the grid has an access transistor 306 connected in series to a low voltage at terminal 310 and to the common node 308 of each EEPROM cell 330 in the row. The gate of the access transistor 306 is connected to wordline WL0. EEPROM cell 330 contains a pFET 304 with a terminal 312 connected to a bitline B0L. EEPROM cell 330 contains an nFET 302 with a terminal 316 connected to a bitline B0R. The pFET 304 and nFET 302 of EEPROM cell 330 are connected in parallel and share a common floating gate 314.

While components have been labeled and described primarily for the lower left EEPROM cell 330, each row contains an access transistor and each EEPROM cell contains the same components arranged in the same configuration. For example, the EEPROM cell immediately to the right of the described cell and shown within the dotted ellipse is EEPROM cell 332. EEPROM cell 332 connects to wordline WL0 and bitlines B1L and B1R in a similar fashion to EEPROM cell 330. Similarly, EEPROM cell 334 is shown within the dashed and dotted ellipse, connects to wordline WL1 and bitlines B2L and B2R in a similar fashion to EEPROM cell 330. It should be understood that an array of any size can be used instead.

Continuing with the example EEPROM cell 330, the common floating gate 314 can be programmed by avalanche hot-hole injection in the nFET 302 (writing a logical "1" to the EEPROM cell 330) and hot-electron injection in the pFET 304 (writing a logical "0" to the EEPROM cell 330). Furthermore, the gate dielectric of the nFET 302 is chosen to enable fast injection of hot holes at low voltage, and the gate dielectric of the pFET 304 is chosen to enable fast injection of hot electrons at low voltage. As an example, for a pFET having $HfO_2$ as gate dielectric, hot-electron injection can be accomplished in less than 10 ns at a source-to-drain voltage of about 3V. For an EEPROM cell 330 operated with about 3V across its nFET 302 for avalanche hot-hole injection and about 3V across its pFET 304 for avalanche hot-electron injection, the applied voltages for array 300 during operation can be as follows.

When no action is being performed, during standby, the voltage on each of the wordlines and bitlines is 0V (WL0=B0L=B0R=0V). The voltage values for WL0, B0L, and B0R for selecting EEPROM cell 330 in array 300 for reading, writing a value "1," or writing a value "0" are as indicated in Table 1 below. The voltages could vary, for example, by about 10% in this specific embodiment without affecting proper operation of the array. Tables of voltages for selecting the other EEPROM cells in array 300 can be derived by substituting the corresponding wordlines and bitlines of the cell being selected.

TABLE 1

|  | WL0 | B0L | B0R |
|---|---|---|---|
| Write "1" | 1.5 V | 0 V | 3.0 V |
| Write "0" | 1.5 V | 3.0 V | 0 V |
| Read | 1.5 V | 1.5 V | 1.5 V |

To write a value "1" to the EEPROM cell 330, the wordline WL0 is raised to about 1.5 V to turn on the access transistor 306, pulling the common node 308 to about 0V (the voltage of terminal 310), the bitline B0L is dropped to about 0V so that there is little voltage across the pFET 304, and the bitline B0R is raised to about 3V, resulting in a voltage of about 3V across the nFET 302, causing hot-hole injection in the nFET 302.

To write a value "0" to the EEPROM cell 330, the wordline WL0 raised to about 1.5 V to turn on the access transistor 306, pulling the common node 308 to about 0V (the voltage of terminal 310), the bitline B0R is dropped to about 0V so that there is little voltage across the nFET 302, and the bitline B0L is raised to about 3.0V to create a voltage of about 3V across the pFET 304, causing hot-electron injection in the pFET 304.

To read the value of the EEPROM cell 330, the wordline WL0 is raised to about 1.5V to turn on the access transistor 306, pulling the common node 308 to about 0V (the voltage of terminal 310), the voltage of B0L and B0R are dropped to about 1.5V, creating a voltage of about 1.5V across the nFET 302 and a voltage of about 1.5V across the pFET 304.

In general, the time needed for hot-carrier injection in nFET 302 and pFET 304 is a strong function of the voltage across the devices during injection. For example, for a pFET having silicon dioxide ($SiO_2$) as gate dielectric, the rate of hot electron injection can increase by about 10 times when the device voltage is changed from about 3V to about 3.5V. A 10% voltage variation is well within the design of typical integrated circuit chips.

For non-selected cells on the same wordline, for example when writing a "1" to another cell, the voltage across the nFETs in the non-selected cells will be about 0V and there will be negligible hot-hole injection in the nFETs in the non-selected cells. Similarly, when writing a "0" in another cell, the voltage across the pFETs in the non-selected cells will be about 0V, resulting in negligible hot-electron injection in the pFETs in the non-selected cells. For non-selected cells on the same output bitline the common nodes in the non-selected cells is "floating," being isolated from low voltage terminal (e.g. terminal 310 connected to the access transistor connected to EEPROM cell 330) because the access transistor is not turned on. This causes the voltage between the pair of bitlines for the cell (e.g. bitline B0L and bitline B0R or bitline B2L and bitline B2R) to be divided between the nFET and the pFET. The net result is that the voltage across either the nFET or the pFET is not large enough to cause hot carrier injection in either the nFET or the pFET.

The use of low injection-barrier materials in the EEPROM cells of array 300 provide superior efficiency, as significantly lower voltages can be used as compared to when conventional materials are used. For example, with a silicon dioxide ($SiO_2$) gate dielectric layer, there is negligible hot-electron injection at voltages less than about 2.5V whereas, with a low injection-barrier material such as HfO2, appreciable hot-electron injection can be achieved at voltages starting at about 1.5V. For programming with electron injection densities of about $1 \cdot 10^{12}/cm^2$, a semiconductor-on-insulator pFET with an HfO2 gate dielectric can be programmed in less than 10 ns at a voltage of 2.5V.

The array 300 can be built on various materials, including bulk semiconductor, semiconductor-on-insulator, or thin films of polycrystalline silicon on insulator. The logic circuits that control the operation of a memory array can be fabricated on the same semiconductor substrate as the memory array to produce a memory chip, or they can be fabricated on a separate substrate and then packaged together with the memory array to form a memory package. These logic circuits are referred to herein as peripheral circuits. The peripheral circuits can be integrated with the memory array(s) on the same semiconductor substrate to improve speed and reliability. Alternatively, to reduce cost, which can be important for large EEPROM systems, the peripheral circuits can be built on bulk semiconductor or semiconductor-on-insulator substrates independent of the array.

Figure 4:
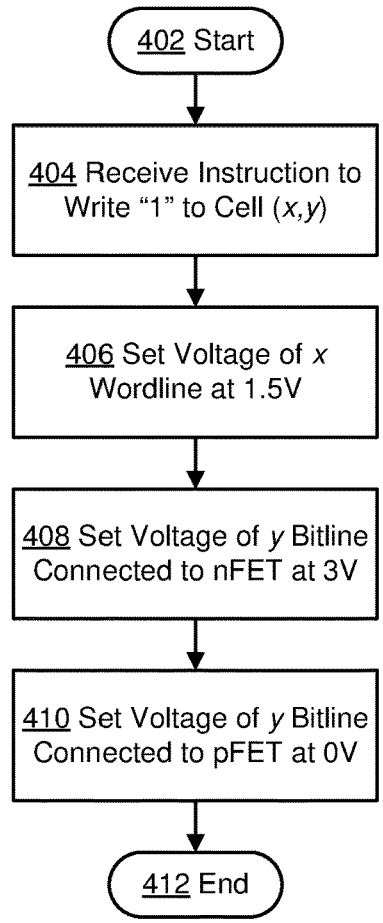
FIG. 4 depicts an example method for writing a logical "1" to an EEPROM cell, in accordance with embodiments of the present disclosure.

Referring now to FIG. 4, depicted is an example method 400 for writing a logical "1" to an EEPROM cell, in accordance with embodiments of the present disclosure. In embodiments, the EEPROM cell described in method 400 can correspond to EEPROM cell 100 of FIG. 1, EEPROM cell 200 of FIG. 2, EEPROM cell 330, 332, or 334 of FIG. 3, or other EEPROM cells disclosed herein and can be located within an array such as array 300 of FIG. 3. Method 400 is described herein as performed by a memory device. In various embodiments, method 400 can alternatively or additionally be performed by a memory controller, a computer system, or another component of a computer system. Method 400 can include more or less operations than those depicted. Method 400 can include operations in different orders than those depicted.

From start 402, method 400 proceeds to 404 and the memory device receives an instruction to write a logical "1" to a cell (x,y) of an array (with x representing the horizontal index and y representing the vertical index). At 406, the memory device sets or turns the voltage of the x wordline to 1.5V. At 408, the memory device sets or turns the voltage of the y bitline which is connected to the nFET of the cell to 3V. For example, in array 300 of FIG. 3, the bitlines connected to the nFETs are B0R, B1R, and B2R (or ByR). At 410, the memory device sets or turns the voltage of the y bitline which is connected to the pFET of the cell to 0V. For example, in array 300 of FIG. 3, the bitlines connected to the pFETs are B0L, B1L, and B2L (or ByL). This creates a voltage of about 3.0V across the nFET of the cell (x,y), causing hot hole injection to the common floating gate of the cell (x,y) (such as common floating gate 314 of FIG. 3). Method 400 ends at 412.

Figure 5:
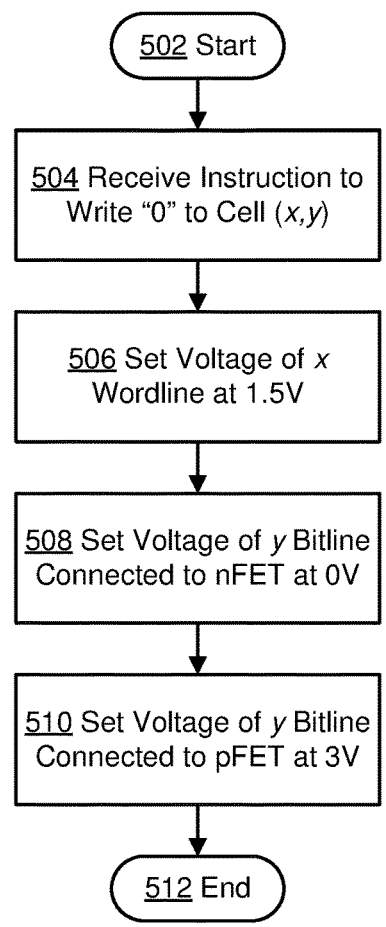
FIG. 5 depicts an example method for writing a logical "0" to an EEPROM cell, in accordance with embodiments of the present disclosure.

Referring now to FIG. 5, depicted is an example method 500 for writing a logical "0" to an EEPROM cell, in accordance with embodiments of the present disclosure. In embodiments, the EEPROM cell described in method 500 can correspond to EEPROM cell 100 of FIG. 1, EEPROM cell 200 of FIG. 2, EEPROM cell 330, 332, or 334 of FIG. 3, or other EEPROM cells disclosed herein and can be located within an array such as array 300 of FIG. 3. Method 500 is described herein as performed by a memory device. In various embodiments, method 500 can alternatively or additionally be performed by a memory controller, a computer system, or another component of a computer system. Method 500 can include more or less operations than those depicted. Method 500 can include operations in different orders than those depicted.

From start 502, method 500 proceeds to 504 and the memory device receives an instruction to write a logical "0" to a cell (x,y) of an array (with x representing the horizontal index and y representing the vertical index). At 506, the memory device sets or turns the voltage of the x wordline to 1.5V. At 508, the memory device sets or turns the voltage of the y bitline which is connected to the nFET of the cell to 0V. For example, in array 300 of FIG. 3, the bitlines connected to the nFETs are B0R, B1R, and B2R (or ByR). At 510, the memory device sets or turns the voltage of the y bitline which is connected to the pFET of the cell to 3V. For example, in array 300 of FIG. 3, the bitlines connected to the pFETs are B0L, B1L, and B2L (or ByL). This creates a voltage of about 3.0V across the pFET of the cell (x,y), causing hot electron injection to the common floating gate of the cell (x,y) (such as common floating gate 314 of FIG. 3). Method 500 ends at 512.

Figure 6:
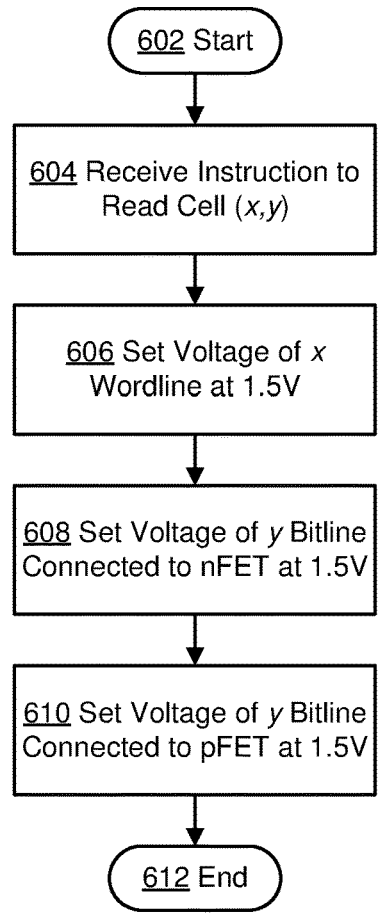
FIG. 6 depicts an example method for reading a value stored in an EEPROM cell, in accordance with embodiments of the present disclosure.

Referring now to FIG. 6, depicted is an example method 600 for reading a value stored in an EEPROM cell, in accordance with embodiments of the present disclosure. In embodiments, the EEPROM cell described in method 600 can correspond to EEPROM cell 100 of FIG. 1, EEPROM cell 200 of FIG. 2, EEPROM cell 330, 332, or 334 of FIG. 3, or other EEPROM cells disclosed herein and can be located within an array such as array 300 of FIG. 3. Method 600 is described herein as performed by a memory device. In various embodiments, method 600 can alternatively or additionally be performed by a memory controller, a computer system, or another component of a computer system. Method 600 can include more or less operations than those depicted. Method 600 can include operations in different orders than those depicted.

From start 602, method 600 proceeds to 604 and the memory device receives an instruction to read the logical value stored in a cell (x,y) of an array (with x representing the horizontal index and y representing the vertical index). At 606, the memory device sets or turns the voltage of the x wordline to 1.5V. At 608, the memory device sets or turns the voltage of the y bitline which is connected to the nFET of the cell to 1.5V. For example, in array 300 of FIG. 3, the bitlines connected to the nFETs are B0R, B1R, and B2R (or ByR). At 610, the memory device sets or turns the voltage of the y bitline which is connected to the pFET of the cell to 1.5V. For example, in array 300 of FIG. 3, the bitlines connected to the pFETs are B0L, B1L, and B2L (or ByL). This creates a voltage of about 1.5V across the nFET of the cell (x,y) and a voltage of about 1.5V across the pFET of the cell (x,y).

Depending on the charge of the common floating gate of the cell (x,y) (such as common floating gate 314 of FIG. 3), the nFET of the cell (x,y) will be either turned on (i.e., conducting) or turned off (i.e., non-conducting). If the nFET of the cell (x,y) is conducting, a current will flow from through the nFET from the bitline connected to the nFET to the common output terminal (e.g. terminal 308 of EEPROM cell 330 in FIG. 3), and continue on through the access transistor to the low voltage terminal (e.g. terminal 310 connected to the access transistor connected to EEPROM cell 330 in FIG. 3). If the nFET of the cell (x,y) is non-conducting, there is negligible current flow through the nFET to the common output terminal (e.g. terminal 308 of EEPROM cell 330 in FIG. 3) and through the access transistor. As a result, the presence of current flow through the access transistor indicates a value of "1" and the absence of current flow through the access transistor indicates a value of "0." Method 600 ends at 612.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A semiconductor device, comprising:
   a substrate;
   a first transistor located on top of the substrate and connected to a first terminal;
   a second transistor located on top of the first transistor and connected in parallel to the first transistor and connected to a second terminal, where the first and second transistors share a common floating gate and a common output terminal; and
   an access transistor connected in series to the common output terminal and a low voltage terminal, the access transistor configured to trigger hot-carrier injection to the common floating gate to change a voltage of the common floating gate.

2. The semiconductor device of claim 1, wherein the first transistor is an n-type transistor and the second transistor is a p-type transistor.

3. The semiconductor device of claim 2, wherein hot-carrier injection is triggered when a voltage across one of the n-type transistor and the p-type transistor is about 3.0 volts.

4. The semiconductor device of claim 1, wherein a voltage of the common floating gate determines a logical state of the semiconductor device.

5. The semiconductor device of claim 1, wherein the first transistor includes a first low injection-barrier material gate dielectric and the second transistor includes a second low injection-barrier material gate dielectric.

6. The semiconductor device of claim 5, wherein the first low injection-barrier material gate dielectric and the second low injection-barrier material gate dielectric are each selected from a group consisting of silicon nitride ($Si_3N_4$), yttrium oxide ($Y_2O_3$), zirconium dioxide ($ZrO_2$), and hafnium dioxide ($HfO_2$).

7. The semiconductor device of claim 1, wherein the first and second transistors are located within a memory cell of an N by M array of memory cells.

8. A memory array, comprising:
an N by M array of memory cells, wherein N represents the number of rows and M represents the number of columns, located on top of a substrate, each memory cell comprising:
a first transistor located on top of the substrate and connected to a first terminal;
a second transistor located on top of the first transistor and connected in parallel to the first transistor and connected to a second terminal, where the first and second transistors share a common floating gate and a common output terminal; and
N access transistors, located on top of the substrate and with one of the N access transistors located in each row of the array, wherein each access transistor is connected in series to a low voltage terminal and the common output terminals of M memory cells in a row, and wherein the access transistors are configured to trigger hot-carrier injection to the common floating gate to change a voltage of the common floating gate.

9. The memory array of claim 8, wherein the first transistor is an n-type transistor and the second transistor is a p-type transistor.

10. The memory array of claim 9, wherein hot-carrier injection is triggered when a voltage across one of the n-type transistor and the p-type transistor is about 3.0 volts.

11. The memory array of claim 8, wherein a voltage of the common floating gate determines a logical state of the semiconductor device.

12. The memory array of claim 8, wherein the first transistor includes a first low injection-barrier material gate dielectric and the second transistor includes a second low injection-barrier material gate dielectric.

13. The memory array of claim 8, further comprising M bitline terminals connected to the first terminals of the memory cells in respective columns of memory cells.

14. The memory array of claim 13, further comprising M bitline terminals connected to the second terminals of the memory cells in respective columns of memory cells.

15. The memory array of claim 8, further comprising N access wordline terminals connected to gates of the N access transistors.

16. A method of storing information on a memory cell in a memory array formed from an N by M array of memory cells, the method comprising:
connecting a first transistor located on top of a substrate to a first terminal;
connecting a second transistor located on top of the first transistor, connected in parallel to the first transistor and connected to a second terminal, where the first and second transistors share a common floating gate and a common output terminal;
connecting an access transistor in series to the common output terminal and to a low voltage terminal; and
triggering, using the access transistor, hot-carrier injection to the common floating gate to change a voltage of the common floating gate.

17. The method of claim 16, wherein the first transistor includes a first low injection-barrier material gate dielectric and the second transistor includes a second low injection-barrier material gate dielectric; and wherein the first low injection-barrier material gate dielectric and the second low injection-barrier material gate dielectric are each selected from a group consisting of silicon nitride ($Si_3N_4$), yttrium oxide ($Y_2O_3$), zirconium dioxide ($ZrO_2$), and hafnium dioxide ($HfO_2$).

18. The method of claim 16, wherein the first transistor is an n-type transistor and the second transistor is a p-type transistor.

19. The method of claim 18, wherein the triggering of hot carrier injection comprises applying a voltage across the n-type transistor of about 3.0 volts to change a charge on the common floating gate and to write a logical "1" to the memory cell.

20. The method of claim 18, wherein the triggering of hot carrier injection comprises applying a voltage across the p-type transistor of about 3.0 volts to change a charge on the common floating gate and to write a logical "0" to the memory cell.

* * * * *